United States Patent
Ohno et al.

(10) Patent No.: US 7,928,546 B2
(45) Date of Patent: Apr. 19, 2011

(54) SEMICONDUCTOR DEVICE AND MANUFACTURING METHOD THEREOF

(75) Inventors: Morifumi Ohno, Tokyo (JP); Motoki Kobayashi, Tokyo (JP); Makoto Terui, Tokyo (JP); Shinji Ohuchi, Tokyo (JP); Mitsuhiko Ogihara, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 368 days.

(21) Appl. No.: 11/892,518

(22) Filed: Aug. 23, 2007

(65) Prior Publication Data

US 2008/0054426 A1 Mar. 6, 2008

(30) Foreign Application Priority Data

Aug. 31, 2006 (JP) .................................. 2006-236699

(51) Int. Cl.
  *H01L 23/02* (2006.01)
(52) U.S. Cl. ......... 257/678; 257/E21.505; 257/E23.003; 438/118
(58) Field of Classification Search .................. 257/678, 257/E21.505, E23.003; 438/118
See application file for complete search history.

(56) References Cited

U.S. PATENT DOCUMENTS

| 4,890,895 A * | 1/1990 | Zavracky et al. | 385/14 |
| 7,535,100 B2 * | 5/2009 | Kub et al. | 257/728 |
| 2004/0259331 A1 * | 12/2004 | Ogihara et al. | 438/462 |
| 2006/0166468 A1 * | 7/2006 | Yonehara et al. | 438/483 |

FOREIGN PATENT DOCUMENTS

| JP | 11-103011 | 4/1999 |
| JP | 2004-179641 | 6/2004 |
| JP | 2004-179646 | 6/2004 |
| JP | 2005-051117 | 2/2005 |
| JP | 2006-041122 | 2/2006 |

* cited by examiner

*Primary Examiner* — Asok K Sarkar
(74) *Attorney, Agent, or Firm* — Rabin & Berdo, PC

(57) ABSTRACT

With the objective of enabling a reduction in the size of a final semiconductor device and its thinning, and attaining facilitation of a manufacturing process, the semiconductor device includes a circuit chip having a flat mounted surface, a circuit chip smaller in size than the former circuit chip, and a sheet-like support. The latter circuit chip is formed over a substrate and has a flat back surface fixed to the substrate and a flat surface positioned on the side opposite to the back surface. The support is bonded to the surface of the latter circuit chip and supports the latter circuit chip. Then, the back surface of the latter circuit chip supported by the support is peeled from the substrate and pressed against the mounted surface, thereby fixing the back surface of the latter circuit chip and the mounted surface by an intermolecular bonding force (e.g., hydrogen bonding).

5 Claims, 17 Drawing Sheets

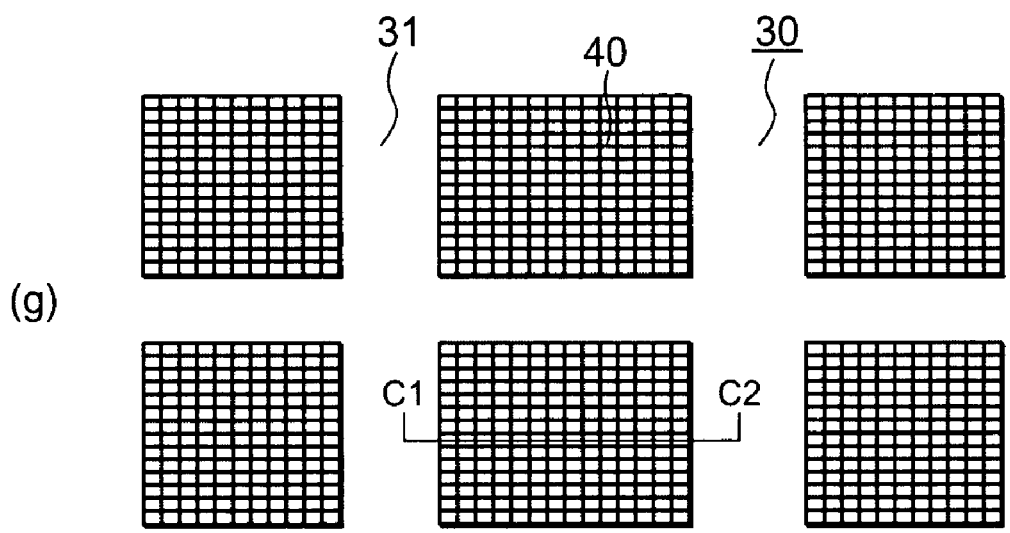
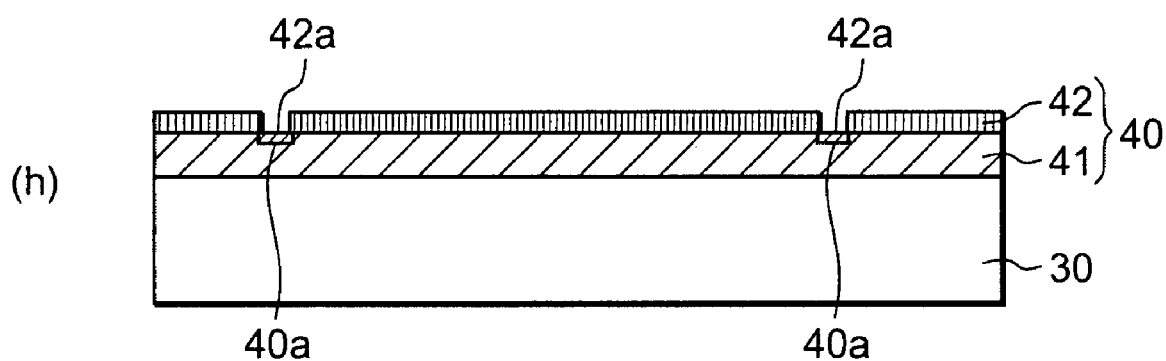
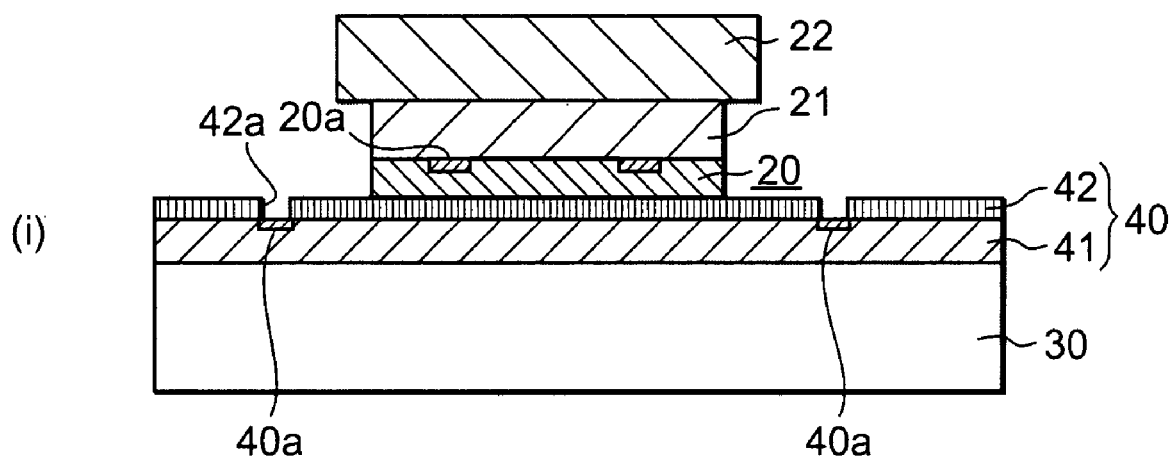
Fig. 2-3

SEMICONDUCTOR DEVICE AND MANUFACTURING METHOD THEREOF

BACKGROUND OF THE INVENTION

The present invention relates to a thin and small-sized semiconductor device wherein active elements comprising semiconductor elements such as a transistor, etc., and passive elements such as a capacitor (condenser) C, an inductor (coil) L, a resistor R and the like are mounted over a substrate or the like in a high density, and a manufacturing method thereof.

As techniques related to a semiconductor device in which active elements and passive elements are mounted on a substrate in a high density, and its manufacturing method, there have been known ones described in, for example, the following patent documents.

Patent document 1: Japanese Unexamined Patent Publication No. He 11(1999)-103011

Patent document 2: Japanese Unexamined Patent Publication No. 2006-41122

Described in the patent document 1 is a semiconductor device manufacturing method for forming a semiconductor device on a main surface of a semiconductor base using a combined semiconductor substrate comprising the semiconductor base having the main surface and a large-diameter holding base for detachably holding a plurality of the semiconductor bases. In the present manufacturing method, for example, the semiconductor device is manufactured in a state in which the semiconductor base is being held by the holding base through a junction portion constituted of an insulting film. The insulating film of the junction portion is formed by hydrogen bonding containing OH groups in such a manner that bond or junction mating/demating is easy and the formed junction portion can be utilized repeatedly.

According to the semiconductor device manufacturing method disclosed in the patent document 1, the plural semiconductor bases and the large-diameter holding base are detachably bonded to one another arbitrarily, thereby enabling mass production while a productivity improvement based on a large-diameter batch processing step is being performed.

The patent document 2 has described a semiconductor device having active and passive elements built therein, which includes an insulating substrate eliminated in a semiconductor device manufacturing process and a circuit module constituted of, for example, a thin-film LCR circuit formed on the insulating substrate without getting involved in the construction of the semiconductor device and which has connecting terminals provided at a surface at which the circuit module is brought into abutment with the insulating substrate.

According to the semiconductor device manufacturing method of the patent document 2, the circuit module formed on the insulating substrate is peeled from the insulating substrate and fixed onto another substrate by an adhesive, thereby achieving high densification, thinning and miniaturization of the semiconductor device.

However, the conventional semiconductor device and its manufacturing method involve the following problems.

In the prior art of the patent document 2, the circuit module constituted of, for example, the LCR circuit formed on the insulating substrate is peeled from the insulating substrate and fixed onto another substrate by the adhesive. Therefore, the size of the semiconductor device increases by the thickness of the adhesive, and an increase in the number of manufacturing process steps due to the addition of an adhesive applying step and the like and complication or the like associated with the manufacturing process occur.

Thus, it is considered that as this measure, the circuit module is fixed onto another substrate by hydrogen bonding containing OH groups such as described in the patent document 1 as an alternative to the adhesive. Since, however, the hydrogen bonding is utilized as the fixing method in the technique of the patent document 1 because the bond mating/demating is easy, it was difficult to allow the circuit module to have such a sufficient junction strength as not to be peeled, where the circuit module was fixed onto anther substrate by the hydrogen bonding.

SUMMARY OF THE INVENTION

The present invention aims to provide a semiconductor device which solves such conventional problems and which enables a reduction in size and thinning as the final semiconductor device and enables facilitation or the like of a manufacturing process, and a manufacturing method thereof.

According to one aspect of the present invention, for attaining the above object, there is provided a method for manufacturing a semiconductor device comprising a mounted member (e.g., substrate or circuit chip) having a flat mounted surface, a circuit chip which is formed over a substrate (e.g., a silicon on insulator hereinafter called "SOI") substrate or bulk substrate) and has a flat back surface fixed to the substrate and a flat surface positioned on the side opposite to the back surface and which is smaller in size than the mounted member, and a sheet-like support which is bonded to the surface of the circuit chip and supports the circuit chip, the method comprising the steps of peeling the back surface of the circuit chip supported by the support from the substrate, pressing the back surface of the circuit chip against the mounted surface, and fixing the back surface of the circuit chip and the mounted surface by an intermolecular bonding force (e.g., hydrogen bonding force between OH groups).

The semiconductor device of the present invention has a vertical stack structure of a wafer-level chip size package (hereinafter called "WCSP") type or the like fabricated using the above manufacturing method.

According to the semiconductor device of the present invention and its manufacturing method, when a circuit chip is peeled upon bonding the circuit chip smaller in size than a mounted member onto the mounted member to join them to each other, the circuit chip is peeled in a state of being applied to a sheet-like support, and the peeled circuit chip is bonded onto the desired mounted member by an intermolecular bonding force (e.g., hydrogen bonding force). Further, the back surface (i.e., the surface located on the side opposite to the mounted member corresponding to a connection target) of the peeled circuit chip is planarized, and a mounted surface of the mounted member is made flat. Furthermore, the surface (i.e., the surface located on the side opposite to the support) of the peeled circuit chip is planarized, whereby the circuit chip and the sheet-like support are bonded to each other at the surfaces flat with respect to each other. Thus, pressure (i.e., relatively small load) applied upon bonding to the mounted surface is uniformly applied to the peeled whole circuit chip, thus making it possible to reliably perform intermolecular bonding. It is possible to prevent that particularly when pressure is partly applied, the structure of the peeled circuit chip is brought to destruction because the circuit chip is thin.

Further, since the circuit chip and the mounted member are fixed by the intermolecular bonding without using the conventional adhesive, a reduction in size and thinning as the final semiconductor device can be realized and the complexity of a manufacturing process due to the addition of the conventional adhesive applying step and the like can be avoided, thus enabling a reduction in cost with the facilitation of the manufacture of the semiconductor device.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 2-1 is a typical manufacturing process diagram showing a specific manufacturing method of the semiconductor device shown in FIG. 1;

FIG. 2-2 is a typical manufacturing process diagram showing the specific manufacturing method of the semiconductor device shown in FIG. 1;

FIG. 2-3 is a typical manufacturing process diagram illustrating the specific manufacturing method of the semiconductor device shown in FIG. 1;

FIG. 2-4 is a typical manufacturing process diagram depicting the specific manufacturing method of the semiconductor device shown in FIG. 1;

FIG. 2-5 is a typical manufacturing process diagram showing the specific manufacturing method of the semiconductor device shown in FIG. 1;

FIG. 3-1 is a typical cross-sectional view related to a manufacturing process showing a specific manufacturing method of a semiconductor device according to a second embodiment of the present invention;

FIG. 3-2 is a typical cross-sectional view related to the manufacturing process showing the specific manufacturing method of the semiconductor device according to the second embodiment of the present invention;

FIG. 3-3 is a typical cross-sectional view related to the manufacturing process showing the specific manufacturing method of the semiconductor device according to the second embodiment of the present invention;

FIG. 4 is a typical structural view of a semiconductor device showing a third embodiment of the present invention;

FIG. 5-1 is a typical construction diagram showing a structure example of an IPD 60 mounted on a semiconductor element 70 shown in FIG. 4;

FIG. 5-2 is a typical construction diagram showing a structure example of the IPD 60 mounted on the semiconductor element 70 shown in FIG. 4;

FIG. 5-3 is a typical construction diagram showing a structure example of the IPD 60 mounted on the semiconductor element 70 shown in FIG. 4;

FIG. 5-4 is a typical construction diagram showing a structure example of the IPD 60 mounted on the semiconductor element 70 shown in FIG. 4;

DETAILED DESCRIPTION OF THE PREFERRED EMBODIMENTS

Figure 1:
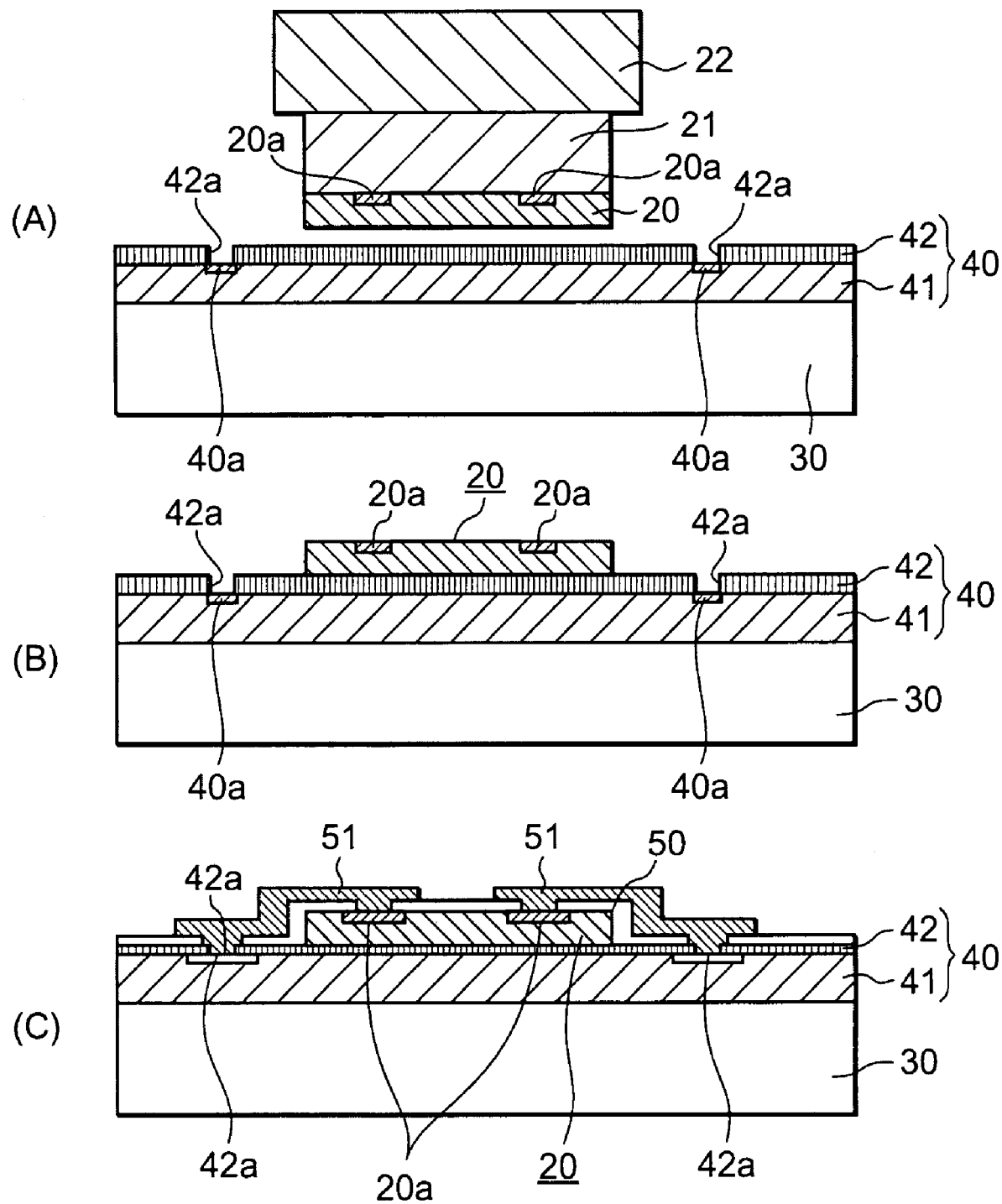
FIG. 1 is a typical view showing a method for manufacturing a semiconductor device according to a first embodiment of the present invention and a sectional structure of the semiconductor device.

A semiconductor device manufacturing method according to the best mode is a method of manufacturing a semiconductor device comprising a mounted member having a flat mounted surface, a circuit chip which is formed over a substrate and has a flat back surface fixed to the substrate and a flat surface-positioned on the side opposite to the back surface and which is smaller in size than the mounted member, and a sheet-like support which is bonded to the surface of the circuit chip and supports the circuit chip, the method comprising the steps of peeling the back surface of the circuit chip supported by the support from the substrate, pressing the back surface of the circuit chip against the mounted surface, and fixing the back surface of the circuit chip and the mounted surface by an intermolecular bonding force.

Preferred embodiments of the present invention will hereinafter be described with reference to the accompanying drawings.

First Preferred Embodiment (Construction of First Embodiment and its Schematic Manufacturing Method)

FIGS. 1(A) through 1(C) are respectively typical diagrams showing a method for manufacturing a semiconductor device according to a first embodiment of the present invention and its sectional structure.

As shown in FIG. 1(A), a thin-film like circuit chip 20 such as a capacitor, an integrated circuit and the like is formed on a first substrate such as an unillustrated silicon (Si) substrate or the like via a peeling film corresponding to a sacrifice layer such as an unillustrated silicon oxide film (SiO2 film). A plurality of connecting pads 20a are exposed on the surface side of the circuit chip 20. The front and back surfaces of the circuit chip 20 are subjected to a planarization or flattening process on the order of, for example, a nanomillimeter (nm) ($=1\times10^{-9}$ millimeters). A sheet-like second support 22 is applied onto the surface of the circuit chip 20 through a first support 21 such as a resist, wax or the like interposed therebetween. In a state in which the support 22 is being applied thereto, an unillustrated peeling layer that covers the back surface of the circuit chip 20 is removed by an etchant or the like, so that the circuit chip 20 is peeled from the unillustrated first substrate.

On the other hand, a circuit forming layer 41 such as a Si layer formed with an integrated circuit or the like that constitutes a circuit chip 40 is provided over a mounted member (e.g., a second substrate such as a Si substrate) 30 for mounting the circuit chip 20 thereon. A plurality of connecting pads 40a are exposed on the surface side of the circuit forming layer 41. The surface of the circuit forming layer 41 is covered with a layer having a mounted surface (e.g., planarization layer) 42 except for apertures or openings 42a for exposing the connecting pads 40a. The planarization layer 42 is a layer for planarizing the surface of the circuit forming layer 41 that constitutes the circuit chip 40.

As shown in FIG. 1(B), the circuit chip 20 supported by the supports 21 and 22 is brought into alignment with the circuit forming layer 41 on the circuit chip 40 side and load is applied to the circuit chip 20 so that the back surface of the circuit chip 20 is bonded onto the surface of the planarization layer 42.

With the planarization of a surface (bonding surface) at which the back surface of the circuit chip 20 and the surface of the planarization layer 42 are bonded, and the application of the load onto the circuit chip 20, the back surface of the circuit chip 20 and the planarization layer 42 are brought close to each other and firmly bonded by an intermolecular bonding force (e.g., hydrogen bonding force between OH groups) bonded to each bonding surface. After completion of such a bonding process, the first and second supports 21 and 22 are removed.

As shown in FIG. 1(C), an interlayer insulating film 50 is formed over the entire surface of the planarization layer 42 on the circuit chip 40 side to which the circuit chip 20 has been bonded. Parts of the interlayer insulating film 50 are made open such that spots corresponding to the connecting pads 20a of the circuit chip 20 and spots corresponding to the connecting pads 40a of the circuit chip 40 are exposed. Next, wirings 51 are selectively formed on the interlayer insulating film 20. The connecting pads 20a of the circuit chip 20 and the connecting pads 40a of the circuit chip 40 are electrically connected to one another by means of the wirings 51 through openings 42a. Thereafter, a passivation film or the like is formed over the entire surface to protect the wirings 51 or the like as needed, whereby the manufacture of the semiconductor device is completed.

In the semiconductor device shown in FIG. 1(C), which has been manufactured in this way, predetermined electrical operations are carried out since the circuit chip 20 and the circuit chip 40 are connected by the wirings 51.

(Specific Manufacturing Method of First Embodiment)

FIGS. 2-1 through 2-5 are typical manufacturing process diagrams showing a specific manufacturing method of the semiconductor device shown in FIG. 1.

In the normal manufacturing method of the first embodiment, there is considered a form in which a plurality of types of circuit chips are bonded onto a circuit forming layer formed on a substrate and then connected to an integrated circuit or the like lying in the circuit forming layer. However, the following description takes up one type of circuit chip as a typical one to achieve simplification of explanations. Its manufacturing method will be explained.

Figures 1, 2:
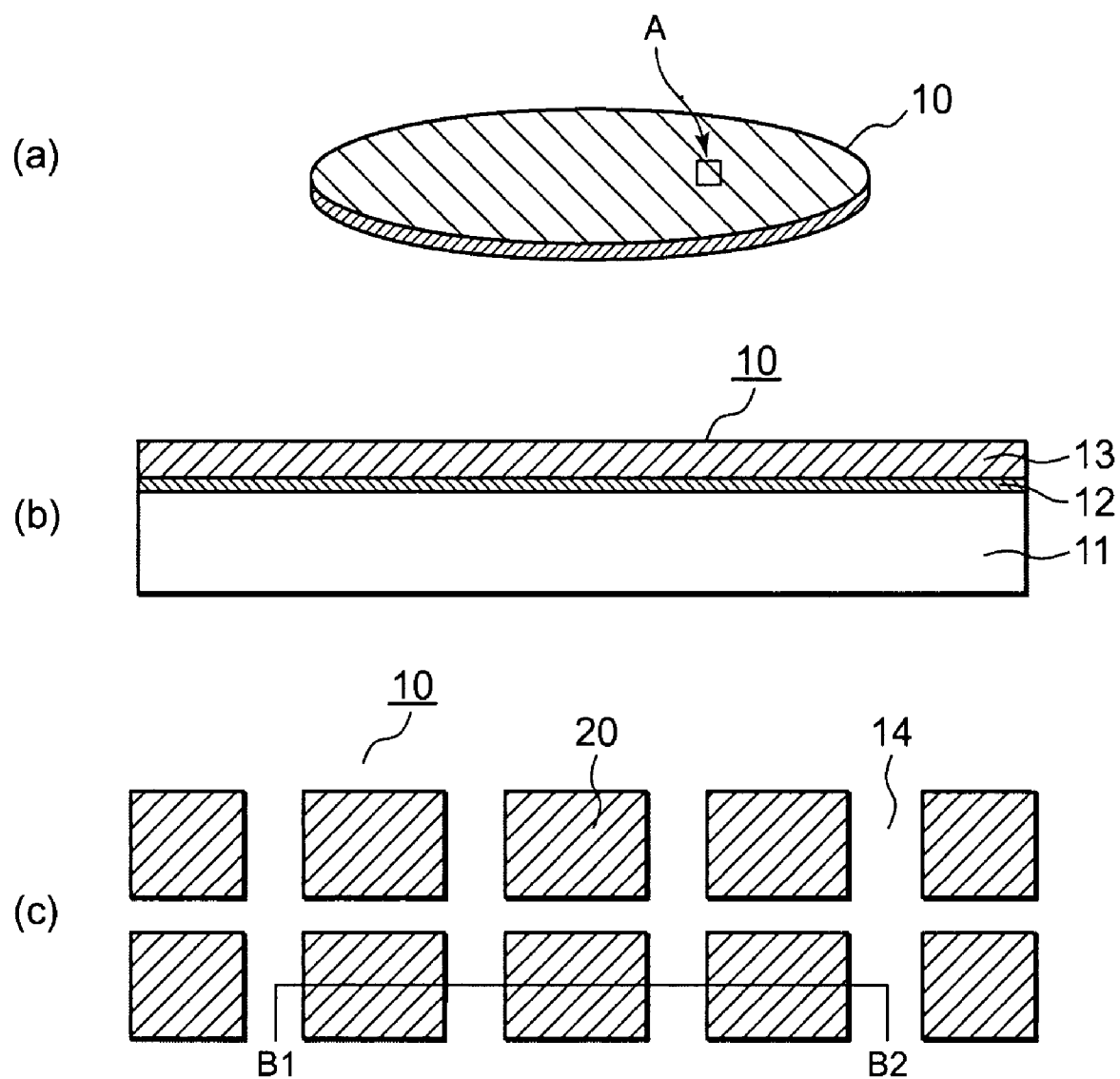
Figure 2:
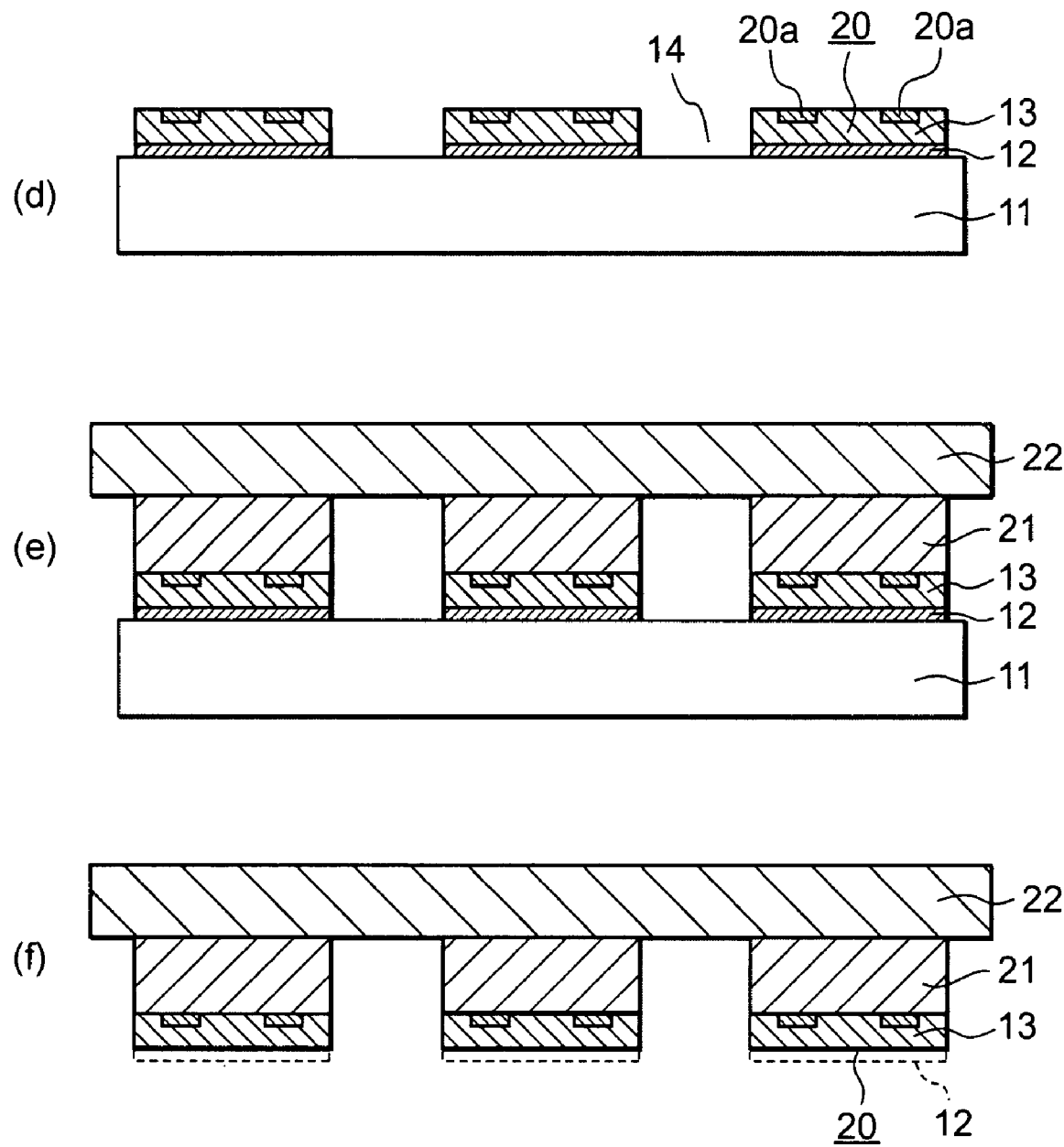

FIG. 2-1(a) is a perspective view showing a first substrate for forming a semiconductor device. A typical cross-sectional view of a partial area A of the first substrate is shown in FIG. 2-1(b).

For instance, an SOI wafer 10 is first prepared as the first substrate. The SOI wafer 10 has a monocrystalline Si substrate 11. A thin-film Si layer 13 constituted of a single crystal, which acts as an operation layer, is laminated over the monocrystalline Si substrate 11 via a peeling layer 12 corresponding to an insulator. The peeling layer 12 is also called a sacrifice layer or an embedded oxide layer (BOX oxide layer) and formed of a SiO2 layer, for example. As the thickness of the peeling layer 12, a range from approximately 50 nm to 800 nm is a preferred example. This means that a suitable thickness range can be determined from the fact that etching proceeds satisfactorily when the peeling layer 12 is selectively etching-removed with respect to the Si substrate 11 and Si layer 13, and the etching surface of the Si layer 13 is flat in nano order after the etching of the peeling layer 12. Circuit elements such as active elements and passive elements, or an integrated circuit and the like are formed in the thin-film Si layer 13. The thickness of the Si layer 13 may preferably range from, for example, approximately 50 nm to 1000 nm as a suitable example. As the thickness of the Si layer 13, a suitable thickness can be determined from the thickness required to form the circuit elements and the integrated circuit or the like and the thickness that enables satisfactory wiring.

FIG. 2-1(C) is a typical plan view showing a state in which circuit chips are formed and arranged on the SOI wafer 10. A cross-sectional view taken along line B1-B2 of the circuit chips is shown in FIG. 2-1(d).

The peeling layer 12 and the Si layer 13 of the SOI wafer 10 are separated at predetermined intervals by isolation regions 14 formed by etching such as a photolithography technique, so that a plurality of circuit chips 20 are formed and arranged. The circuit chips 20 are respectively constituted of the peeling layers 12 and Si layers 13 separated by the isolation regions 14, and the separated isolation layers 12 are exposed. A plurality of connecting pads 20a are provided on the surface sides of the respective circuit chips 20 although their illustrations are omitted in FIGS. 2-1(b) and 2-1(c).

FIG. 2-2(e) is a typical cross-sectional view showing a state in which first and second supports are formed on the circuit chips 20.

The first supports 21 are respectively formed individually (selectively) on the Si layers 13 at the separated circuit chips 20 using a resist material and a wax material or the like by the photolithography technique. After the peeling of the respective Si layers 13 from the Si substrate 11 in a post or package process, the first supports 21 have the function of protecting the respective Si layers 13. After the formation of a plurality of the first supports 21, a sheet-like second support 22 such as an adhesive sheet is bonded onto these first supports 21. After the peeling of the respective Si layers 13 from the Si substrate 11 in the post process, the second support 22 has the function of joining and retaining the respective Si layers 13 so as not to be scattered.

FIG. 2-2(f) is a typical cross-sectional view showing a state in which the circuit chips 20 are peeled from the Si substrate 11.

After the formation of the first and second supports 21 and 22 on the plurality of circuit chips 20, the SOI wafer 10 is immersed into, for example, an acid sacrifice layer etchant such as hydrofluoric acid. Since the peeling film 12 is removed when the SOI wafer is immersed therein for an appropriate period of time, the Si layers 13 constituting the circuit chips 20 supported by the first and second supports 21 and 22 are peeled from the Si substrate 11. The Si layers 13 that constitute the respective circuit chips 20 are individually supported by the first supports 21 and joined and retained by means of the second support 22.

Figures 2, 3, 4:
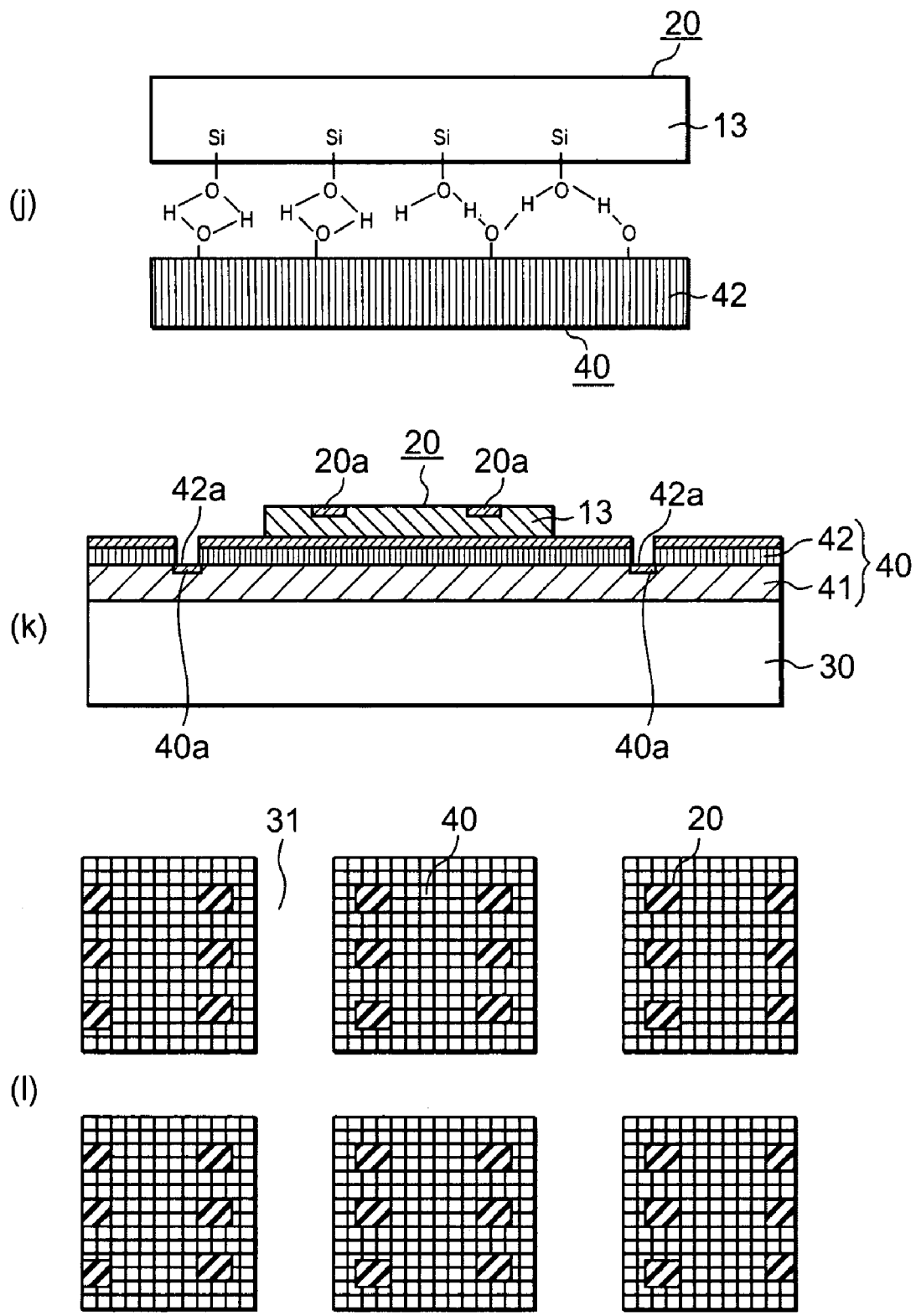

FIG. 2-3(g) is a typical plan view showing a second substrate for mounting the circuit chips 20. A cross-sectional view taken along line C1-C2 of the second substrate is shown in FIG. 2-3(h).

The second substrate is constituted of, for example, a Si substrate 30. A plurality of circuit chips 40 divided at predetermined intervals by a plurality of division regions 31 are formed on the Si substrate 30. Each of the circuit chips 40 has a circuit forming layer 41 with an integrated circuit or the like formed in a Si layer. A planarization layer 42 corresponding to a top layer is formed on the circuit forming layer 41. A plurality of connecting pads 40a for connecting to the circuit chips 20 for bonding onto the circuit forming layers 41 are provided on the surface sides of the circuit forming layers 41. The planarization layer 42 that covers the circuit forming layers 41 has the function of planarizing the Si layers 13 constituting the circuit chips 20 to bond the same onto the circuit forming layers 41. The planarization layer 42 is formed of, for example, an organic or inorganic applied film such as polyimide, SOG (Spin-On-Glass) or the like or formed of an insulating film such as a thin-film silicon oxide film (SiO2 film), a silicon nitride film (SiN film) or the like. Openings or apertures 42a for exposing the pads 40a respectively are formed in the planarization layer 42 by the photolithography technique.

FIG. 2-3(i) is a typical cross-sectional view showing a state in which each circuit chip 20 is bonded onto its corresponding circuit chip 40.

In order to bond the respective circuit chips 20 shown in FIG. 2-2(f) onto the circuit chip 40 of FIG. 2-3(i) by handling the respective circuit chips 20 shown in FIG. 2-2(f), the second support 22 that supports the respective circuit chips 20 of FIG. 2-2(f) through the first supports 21 interposed therebetween is individually cut. The Si layers 13 that constitute the respective circuit chips 20 respectively supported by the first and second supports 21 and 22 are picked up and brought into alignment with their corresponding bonding regions of the circuit chips 40, after which a predetermined load is imposed thereon. The load can be set to a range of approximately 1 to 30 kg/cm², for example. With planarization of each bonding surface and load application, the Si layer 13 located on the back surface side of each circuit chip 20 and the planarization layer 42 located on the surface side of each circuit chip 40 are brought close to each other, whereby they are firmly bonded to each other by hydrogen bonding between OH groups bonded to each bonding surface.

FIG. 2-4(j) is a typical cross-sectional view showing the manner of a bonding interface at which the Si layer 13 and the planarization layer 42 are bonded to each other by hydrogen bonding.

All other circuit chips 20 cut as shown in FIG. 2-2(i) are bonded to predetermined positions of other circuit chips 40 shown in FIG. 2-3(g) in the same manner as described above.

FIG. 2-4(k) is a typical cross-sectional view showing a state subsequent to the removal of the first and second supports 21 and 22 from the circuit chips 20.

After the completion of the bonding process, the first supports 21 of the first and second supports 21 and 22 that support the respective circuit chips 20 are removed and the second supports 22 bonded thereto are also removed. In the step of removing the first supports 21, for example, a remover or the like for removing a resist material can be used. In order to enhance a bonding strength by the hydrogen bonding between the Si layer 13 and the planarization layer 42 after the removal of the supports, anneal processing can also be carried out suitably at a temperature which no damages the circuit chips 20 and 40.

FIG. 2-4(l) is a plan view typically showing an example of a form in which predetermined circuit chips 20 are bonded onto the respective circuit chips 40.

FIG. 2-5(m) is a diagram similar to FIG. 1(C) and is a typical cross-sectional view showing an example of a state in which the circuit chip 40 and the circuit chip 20 bonded onto the same are connected to each other.

An interlayer insulating film 50 such as a SiN film is formed over the entire surface of the planarization layer 42 located on the side of the circuit chip 40 onto which the circuit chip 20 is bonded. Parts of the interlayer insulating film 50 are made open in such a manner that spots corresponding to the connecting pads 20a of the circuit chip 20 and spots corresponding to the connecting pads 40a of the circuit chip 40 are exposed. Next, a wiring layer such as an aluminum/copper/silicon alloy (AlSiCu alloy) is formed over the entire surface of the interlayer insulating film 50. The wiring layer is selectively etched by the photolithography technique to form wirings 51. The connecting pads 20a of the circuit chip 20 and the connecting pads 40a of the circuit chip 40 are electrically connected by the wirings 51 through the openings 42a. Thereafter, a passivation film or the like is formed over the entire surface to protect the wirings 51 or the like as needed, whereby the manufacture of the semiconductor device is completed.

(Advantageous Effects of First Embodiment)

According to the first embodiment, such advantageous effects as described in the following (1) and (2) are obtained.

(1) When the circuit chips 20 are peeled off upon joining the circuit chips 20 different in size from the circuit chips 40 (i.e., small in size) onto the circuit chips 40 by bonding, the circuit chips 20 are peeled off in a state in which they have been bonded to the sheet-like second support 22 through the first supports 21, and each peeled circuit chips 20 is bonded onto the desired circuit chip 40 by hydrogen bonding. Further, the back surface (i.e., the surface located on the side opposite to the circuit chip 40 corresponding to a bonding target) of each peeled circuit chip 20 is planarized and the circuit forming layer 41 at the surface of the circuit chip 40 is planarized by the planarization layer 42. Furthermore, the surface of the peeled circuit chip 20 (i.e., the surface located on the side opposite to each of the supports 21 and 22) is planarized. Thus, the circuit chips 20 are bonded to the sheet-like second support 22 at the surfaces flat with respect to one another through the first supports 21. Consequently, the pressure (i.e., relatively small load) applied upon bonding to the circuit chip 40 is uniformly applied to the entire peeled circuit chips 20, so that the hydrogen bonding can be performed reliably. In particular, it is possible to prevent the structure of each peeled circuit chip 20 from breaking when the pressure is partly applied because each peeled circuit 20 is thin.

(2) Since the circuit chips 20 and the circuit chips 40 are fixed by hydrogen bonding without using the conventional adhesive, a reduction in the size as the final semiconductor device and its thinning can be realized and the complication of the manufacturing process by addition of the conventional adhesive applying step or the like can be avoided. Further, a reduction in cost with the facilitation of production of the semiconductor device is also enabled.

Second Preferred Embodiment

A second embodiment of the present invention relates to a method for manufacturing a semiconductor device in which circuits are formed on a first substrate (e.g., a SOI wafer) using the hydrogen bonding employed in the first embodiment. The second embodiment relates particularly to a μ (micro)Film chip lift off (hereinafter "μFLO") of circuit chips (e.g., LCR circuit chips, transistor-gate array chip, etc.) using a SOI wafer, which makes use of an epitaxial•lift•off (hereinafter called "ELO")/epitaxial•film•bonding (corresponding to a method for performing bonding using an intermolecular boding force like the hydrogen bonding) mounting technique, and to its μFilm chip bonding (hereinafter called "μFB")

Incidentally, the ELO/EFB of the second embodiment is based upon an ELO/EFB mounting technique corresponding to a gallium•arsenic (GaAs) light-emitting diode mounting technique. In the following description, only the embodiment related to the μFLO/μFB manufacturing method will be explained.

That is, the second embodiment relates to a method for forming a circuit chip (e.g., μFilm chip corresponding to a thin film chip of, for example, about 20 μm or less) mountable on a circuit chip (e.g., SiIC chip or the like) to thin a stacked or layered structure of each flip chip part having a conventional bump structure, and to a μFLO/μFB method corresponding to a method for mounting the circuit chip on a circuit chip (e.g., SiIC chip or the like) used as its substrate.

FIGS. 3-1 through 3-3 are typical cross-sectional views related to a manufacturing process showing a specific manufacturing method of the semiconductor device according to the second embodiment of the present invention. Constituent elements common to those shown in FIG. 1 and FIGS. 2-1 through 2-5 illustrative of the first embodiment are given common reference numerals respectively.

In the following manufacturing process, for instance, an example of a MIM (Metal•Insulator•Metal) capacitor•μFilm•chip formed on a SOI wafer is shown as one example of a μFilm•chip corresponding to a circuit chip. The MIM capacitor is a capacitor constituted of a metal/insulator/metal. Since the parasitic capacitance of an electrode interface can be brought to zero by using a metal as for an electrode, high capacitance is enabled as compared with such a capacitor that poly Si is used as a conventional electrode.

In a process step (corresponding to the step of FIG. 2-1(b)) of FIG. 3-1(a), a SOI wafer 10 is first prepared as a first substrate.

In a SOI wafer step (corresponding to the steps of FIG. 2-1(c) and FIG. 2-2(d)) of FIG. 3-1(b), MIM capacitors 15 each corresponding to the circuit chip 20 employed in the first embodiment are formed on the SOI wafer 10 using a general silicon wafer process (including, for example, an interlayer insulating film forming step, a wiring material depositing step, a photolithography process, etc.) as a semiconductor manufacturing process (SOI wafer process step in a semiconductor process).

In a SOI wafer•passivation step of FIG. 3-1(c), a passivation film 16 is formed over the entire surface.

In an SOI trench•etching step (corresponding to the steps of FIG. 2-1(c) and FIG. 2-2(d)) of FIG. 3-1(d), the Si layer 13 provided on the surface of the SOI wafer 10 is removed by silicon•trench•etching to make open a BOX oxide layer corresponding to a peeling layer 12 used as a sacrifice film. A Si wafer mesa forming pre-step of the μFilm chip is completed in accordance with the above silicon wafer process.

In a process step (corresponding to the step of FIG. 2-2(e)) of FIGS. 3-2(e) and 3-2(f), a μFLO lift off mask 17 for the μFLO process step of FIG. 3-2(f) is formed using a spray development device or the like to lift off first supports 21A. Subsequently, the first supports 21A are adhered to a glass substrate used as a second support 22A through a laminate film or the like constituted of a UV (Ultraviolet) sheet/thermal peel sheet. These steps of FIGS. 3-2(f) and 3-2(g) are identical to ELO employed in GaAs, for example.

In a wet etching step (corresponding to the step of FIG. 2-2(f)) of FIG. 3-2(f), the BOX oxide layer corresponding to the peeling layer 12 used as the sacrifice film is removed by etching to separate the same from the Si substrate 11. The μFLO is completed according to the above process steps.

In μFB steps (corresponding to the steps of FIGS. 2-3(h) and 2-3(i), FIG. 2-4(k) and FIG. 2-5(m)) of FIGS. 3-3(i) through 3-3(l), a description will be made of bonding (μFB) of the μFilm chip located on each second support 21A, which is formed by the μFLO of FIGS. 3-1 and 3-2, onto a Si wafer 30A.

In a dividing step (corresponding to the steps of FIGS. 2-3(h) and 2-3(i)) of FIG. 3-3(i), unnecessary ones of the plurality of first supports 21A are removed by division in a manner similar to the EFB step used in GaAs, for example.

In a bonding step (corresponding to the steps of FIGS. 2-3(h) and 2-3(i)) of FIG. 3-3(j), the cleaning of a connection surface of the μFilm•chip located on the second support 21A, which is formed by the μFLO, and the surface of the mounted Si wafer 30A used as the substrate, and their surface processing are performed. In this case, a surface treatment method is selected depending on the states of connection interfaces of a Si surface, a SiN film and a silicon nitride film (SiON film) or a SiO2 film, etc. In the case of the Si surface as one example, hydrogen (H) terminating process may preferably be carried out. Subsequent to these surface processes, bonding is performed. Connections are carried out by hydrogen bonding based on crimping of both surfaces subject to the surface processing.

In a μFB step (corresponding to the step of FIG. 2-4(k)) of FIG. 3-3(k), the first and second supports 21A and 22B are removed by thermal peeling to complete μFB. The μFB step for these is basically identical to the EFB step and there is no additional limitation.

In a WCSP step (corresponding to the step of FIG. 2-5(m)) of FIG. 3-2(l), the following processing is performed. The WCSP is of a package that completes all assembling steps in a wafer state. The WCSP has such an outer shape that terminals are arranged in lattice form on the back surface of the package in a manner similar to an FBGA (Fine Pith BallGrid Array). In the WCSP, pads of an LSI are relocated to external terminals of the package respectively. Using this redistribution line technique, contact opening, a metal wiring step and a passivation step are performed on the Si substrate 30A, followed by leading to their completion.

(Advantageous Effects or the Like of Second Embodiment)

According to the second embodiment, the circuits are formed in the first substrate (e.g., SOI wafer) 10 using the intermolecular bonding (e.g., hydrogen bonding) of the first embodiment. Therefore, an advantageous effect nearly similar to the first embodiment is brought about. Further, such advantageous effects as described in the following (1) and (2) are also brought about.

(1) In the flip chip on which the thin film chip (μFilm•chip) subjected to the execution of μFLO/μFB as in the second embodiment, electrical connections between a plurality of chips unrestricted by bumps and wire bonding pitches are enabled as compared with the flip chip formed by the bumps or wire bonding as in the prior art, and a substantial reduction in substrate chip size is enabled. Further, a plurality of different types of chips (of at least two types or more) can be mounted by a mounting/manufacturing method.

(2) As the μFilm•chip of the second embodiment, may also be mentioned, for example, an LCR circuit of an inductor, a resistor and the like, a transistor gate array chip using a SOI wafer, a diode array chip, etc. in addition to the MIM capacitor. However, the manufacturing process thereof is similar to one for the MIM capacitor, and similar advantageous effects are obtained.

Methods for manufacturing WCSPs using the hydrogen bonding employed in the first embodiment will be explained below in accordance with third through seventh embodiments.

Third Preferred Embodiment

A third embodiment relates to a method for manufacturing a multi•chip•package (hereinafter called "MCP") wherein a circuit chip (e.g., a passive element integrated chip, which is hereinafter called "IPD") formed using a semiconductor process or a WCSP process is mounted on a circuit chip (e.g., semiconductor element) by EFB (a bonding method using an intermolecular bonding force).

In a method of manufacturing an MCP corresponding to one of conventional semiconductor devices, when, for example, a semiconductor element and chip parts are mounted on the same package, the chip parts are solder-joined to an interposer substrate (corresponding to a relay substrate formed with chip-to-chip or interlayer connecting wirings) and thereafter the semiconductor element is mounted onto the interposer substrate through an adhesive interposed therebetween, and the semiconductor element and the interposer substrate are electrically bonded to each other by bonding wires such as gold (Au). Thereafter, a semiconductor element mounting surface is covered with an encapsulating or sealing resin over its entirety, and solder terminals are formed on a terminal forming surface located on its opposite side.

In the method for manufacturing the MCP structure with such conventional chip parts built therein, the following problems (i) and (ii) are considered.

(i) Since each of the chip parts is thicker than the semiconductor element, and its mounting height is 0.3 mm or higher, it is difficult to thin the total thickness of the package.

(ii) Since the chip parts are mounted around the semiconductor element, it is difficult to miniaturize the outer size of the package.

The third embodiment exercises the following contrivances to solve such problems.

FIGS. 4(a) through 4(c) are typical structural views of a semiconductor device showing the third embodiment of the present invention, wherein FIG. 4(a) is a plan view, FIG. 4(b) is a cross-sectional view taken along line D1-D2 of FIG. 4(a), and FIG. 4(c) is an enlarged cross-sectional view illustrative of an IPD and a semiconductor element portion in FIG. 4(b), respectively.

An IPD 60 in which a passive element 62 is formed over a Si substrate 71 is peeled from a SiO2 film layer in a semiconductor process or a WCSP process. Thereafter, the IPD 60 is mounted onto a predetermined spot or place on a semiconductor element 70 by an EFB bonding method. Metal wirings 63 formed using a plating technique or a sputter technique electrically connect between the IPD 60 and the semiconductor element 70.

The semiconductor element 70 with the IPD 60 mounted thereon is mounted over an interposer substrate 80 through a die bond material interposed therebetween, and the semiconductor element 70 and the interposer substrate 80 are connected by bonding wires 82. Thereafter, a semiconductor element mounting surface is covered with a sealing resin 83 over its entirety, and solder terminals 84 are formed on a terminal forming surface on its opposite side.

FIGS. 5-1(a) and 5-1(b) through FIGS. 5-4(a) and 5-4(b) are typical construction diagrams comprising plan views (a) and cross-sectional views (b) showing structure examples of the IPD 60 mounted over the semiconductor element 70 shown in FIG. 4.

Figures 2, 3, 4, 5:
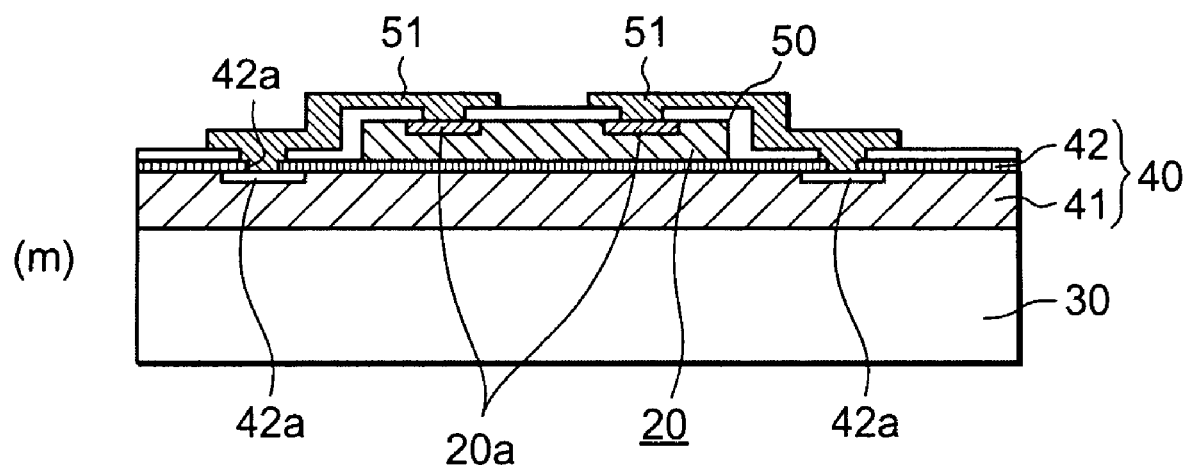
Figures 1, 3:
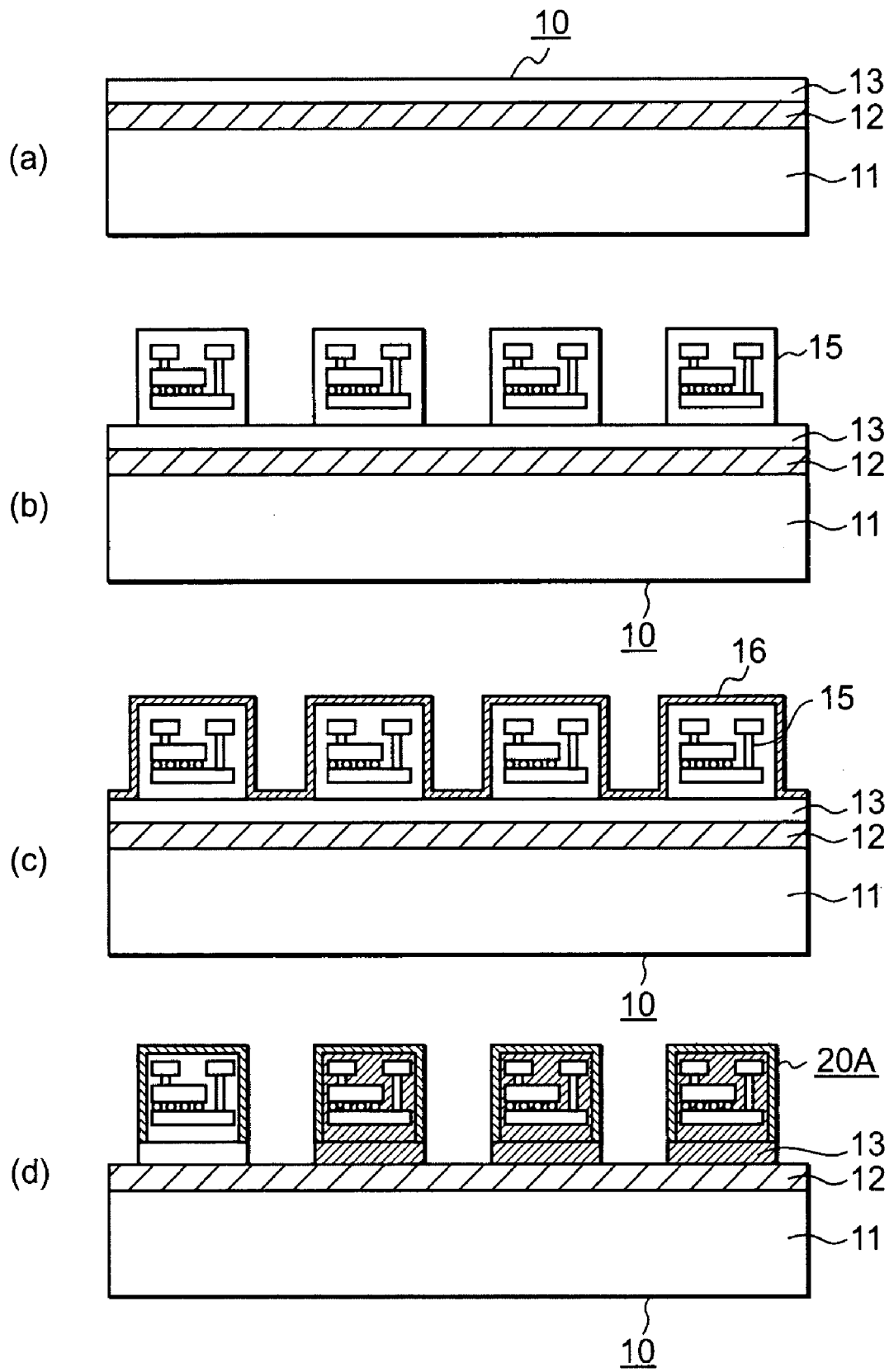
Figures 2, 3:
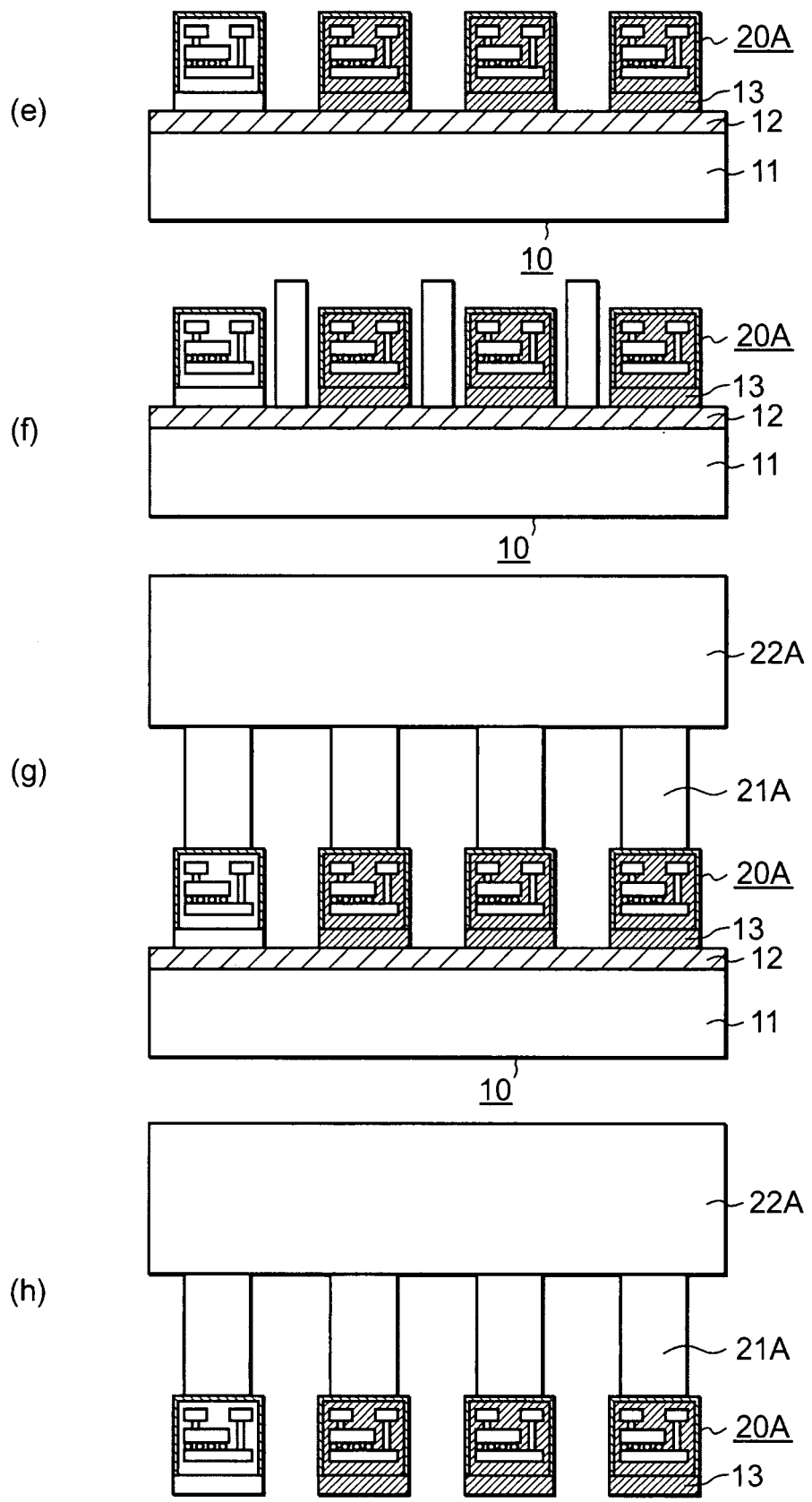
Figure 3:
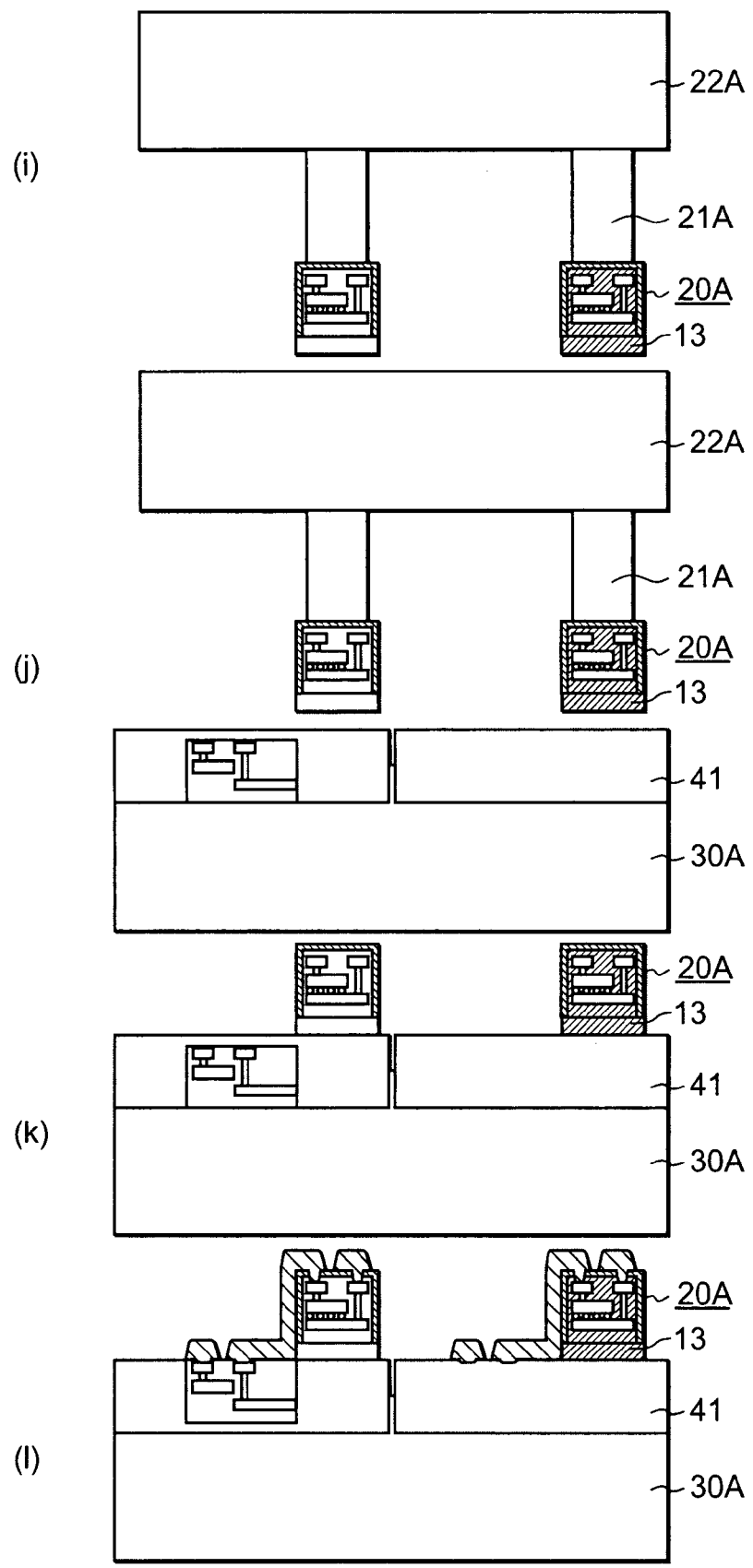
Figure 4:
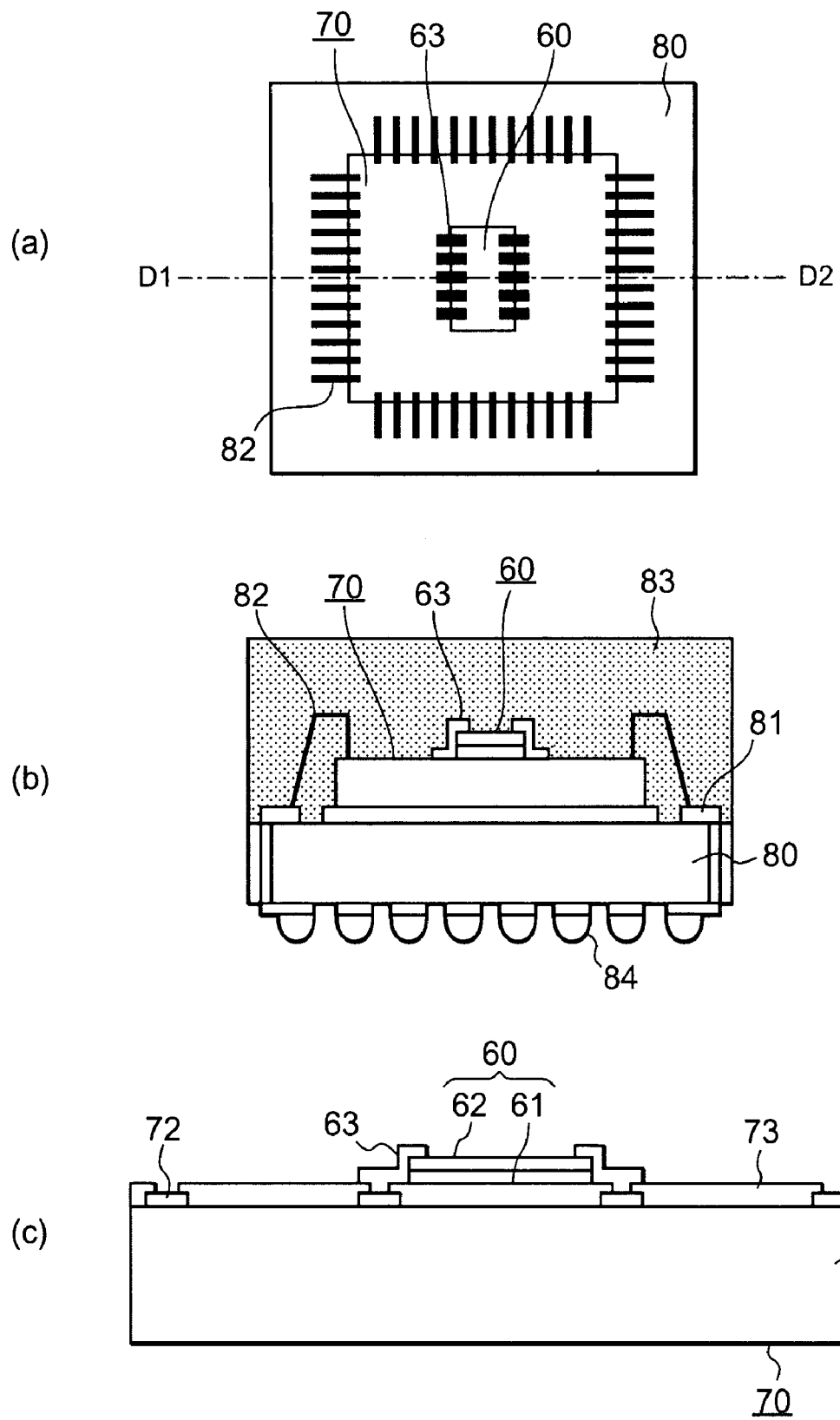
Figures 1, 5:
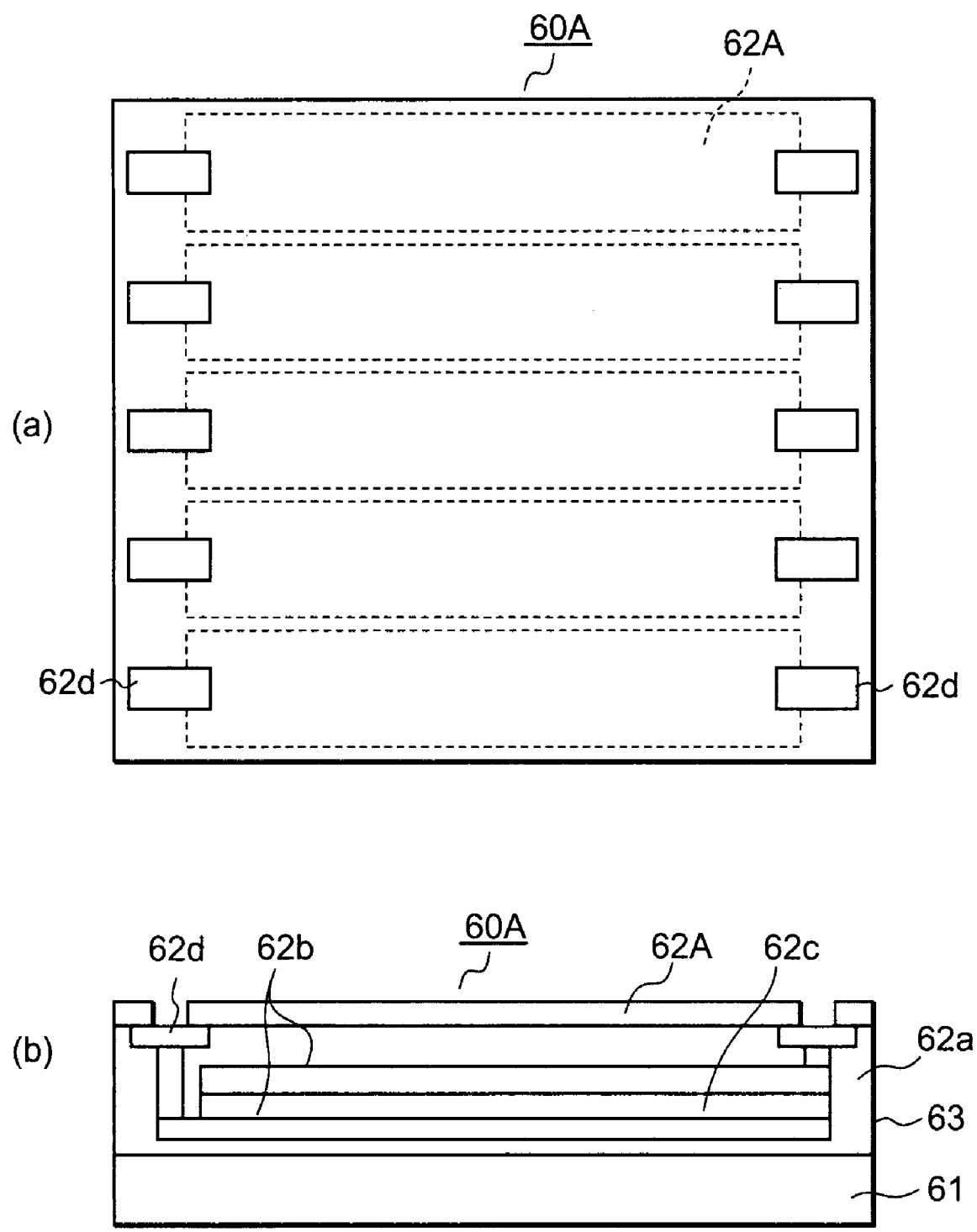
Figures 2, 5:
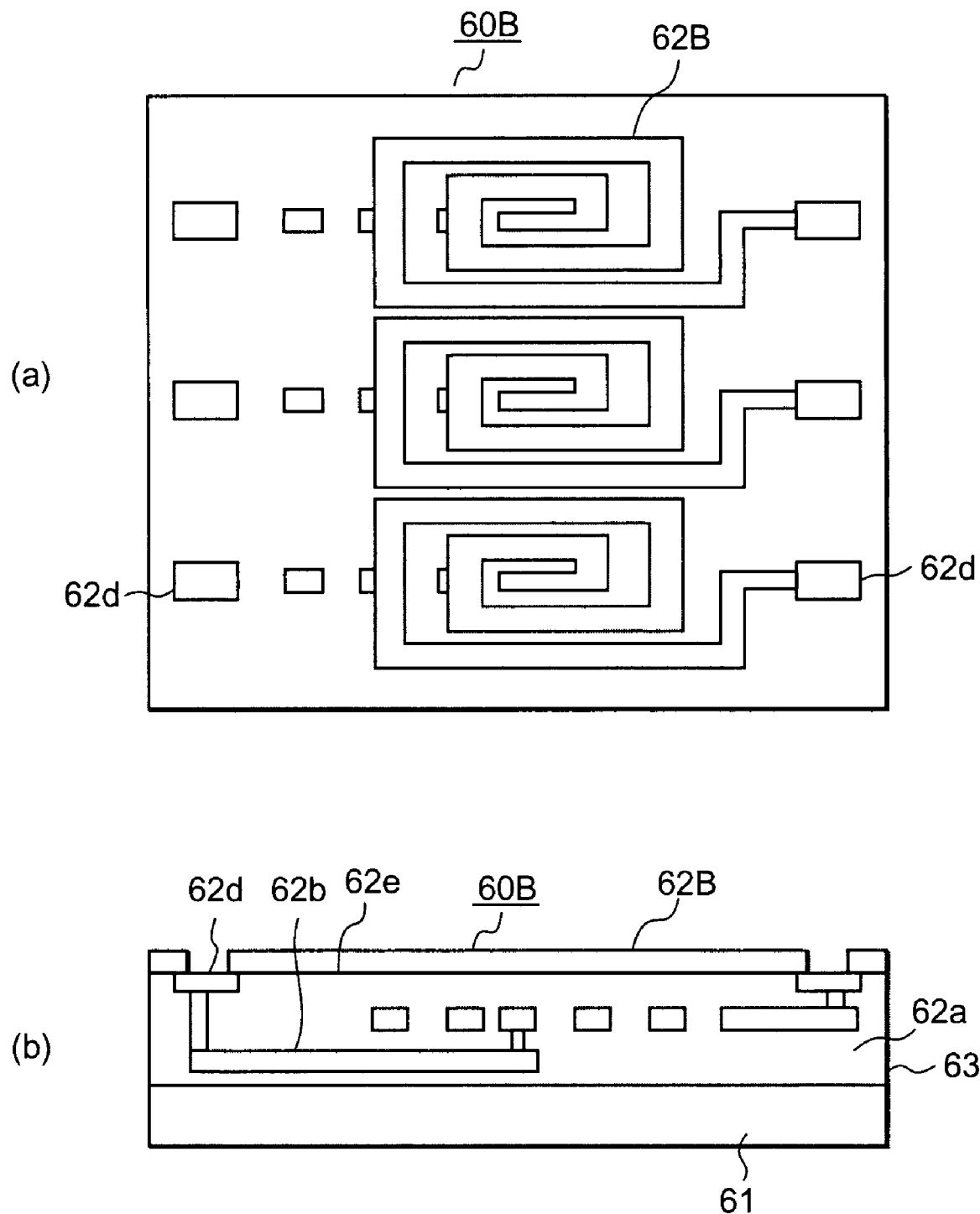
Figures 3, 5:
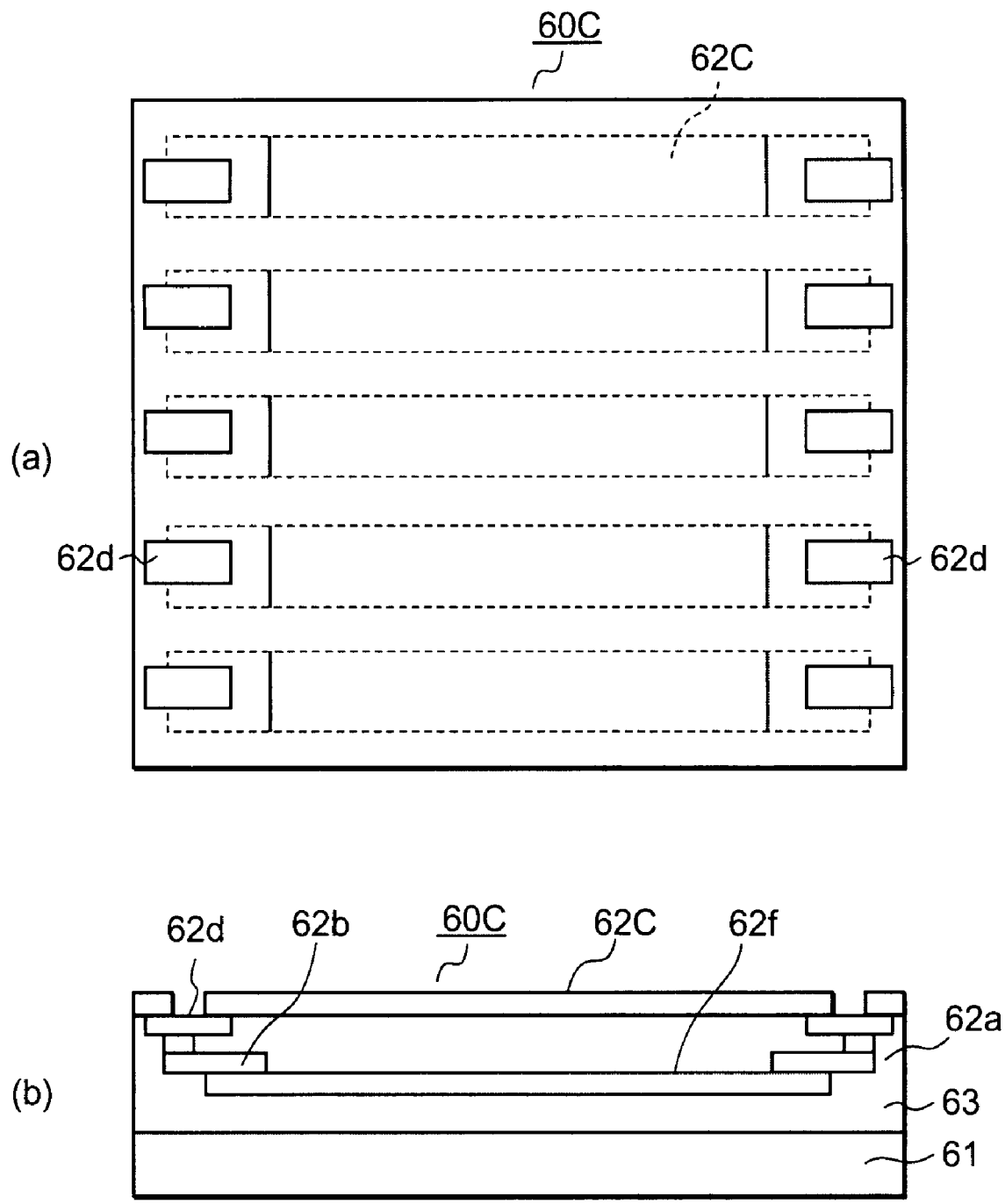
Figures 4, 5:
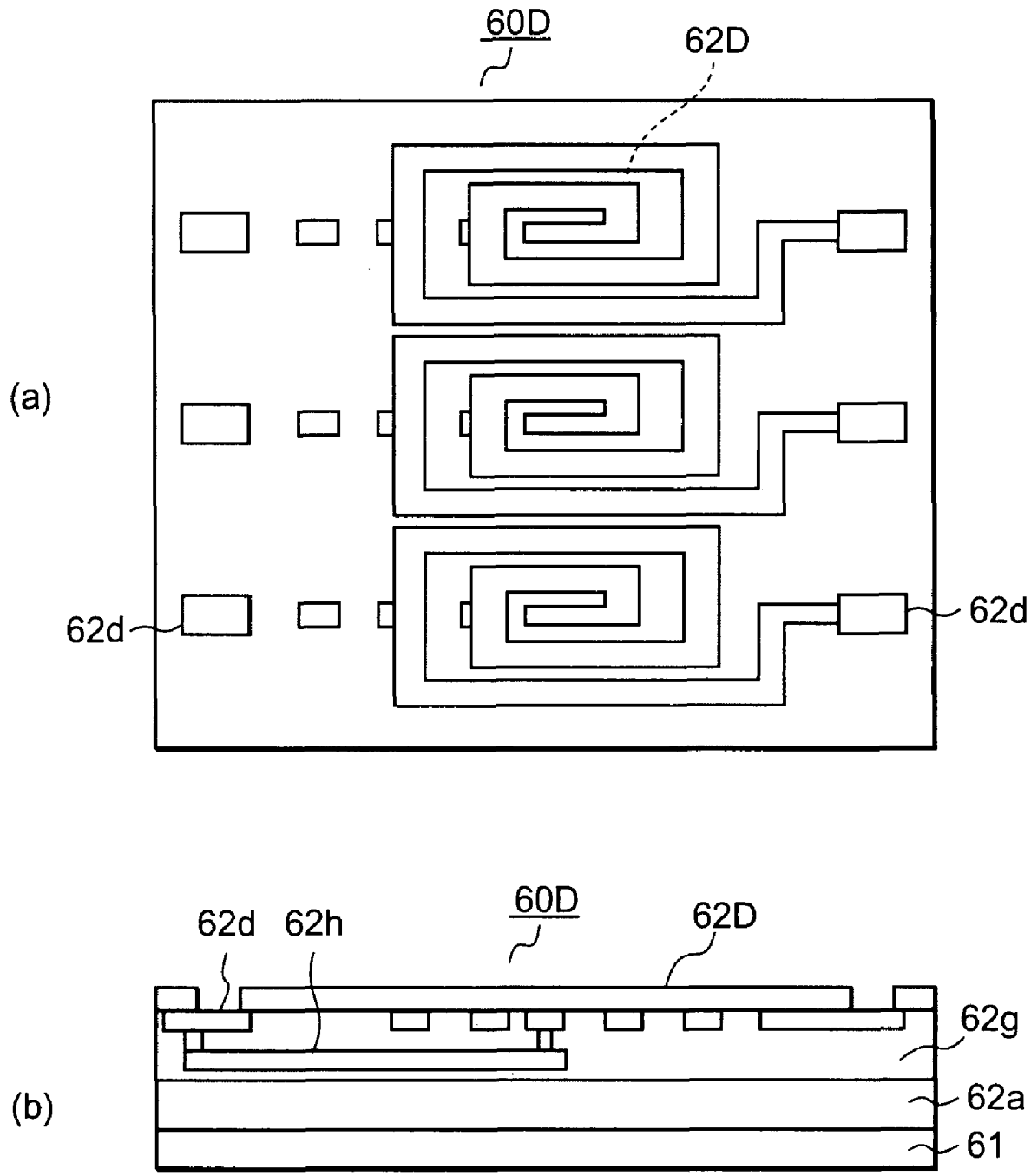

FIGS. 5-1(a) and 5-1(b) show a capacitor chip 60A fabricated by a semiconductor process, FIGS. 5-2(a) and 5-2(b) show an inductor chip 60B fabricated by a semiconductor process, FIGS. 5-3(a) and 5-3(b) show a resistance chip 60C fabricated by a semiconductor process, and FIGS. 5-4(a) and 5-4(b) show an inductor 60D fabricated by a WCSP process.

In the capacitor chip 60A shown in FIGS. 5-1(a) and 5-1(b), capacitors 62A each corresponding to a passive element 62 are formed by the semiconductor process and thereafter the capacitor chip is peeled from a SiO2 film layer 62a. A passive element forming layer 63 is disposed on an EFB bonding layer 61. The thickness of the capacitor chip 60A ranges from about 2.0 to 5.0 µm. The capacitor 62A comprises a semiconductor internal wiring 62b and a dielectric layer 62c. Each of connecting pads 62d is connected to the semiconductor internal wiring 62b. The capacitor chip is covered with a passivation film 62e substantially over its entirety.

In the inductor chip 60B shown in FIGS. 5-2(a) and 5-2(b), inductors 62B each corresponding to a passive element 62 are formed by the semiconductor process and thereafter the inductor chip is peeled from a SiO2 film layer 62a. A passive element forming layer 63 is disposed on an EFB bonding layer 61. The thickness of the inductor chip 60B ranges from about 2.0 to 5.0 µm. The inductor 62B comprises a semiconductor internal wiring 62b. Each of connecting pads 62d is connected to the semiconductor internal wiring 62b. The inductor chip is covered with a passivation film 62e substantially over its entirety.

In the resistance chip 60C shown in FIGS. 5-3(a) and 5-3(b), resistors 62C each corresponding to a passive element 62 are formed by the semiconductor process and thereafter the resistance chip is peeled from a SiO2 film layer 62a. A passive element forming layer 63 is disposed on an EFB bonding layer 61. The thickness of the resistance chip 60C ranges from about 2.0 to 5.0 µm. The resistor 62C comprises a semiconductor internal wiring 62b and a resistor 60f. Each of connecting pads 62d is connected to the semiconductor internal wiring 62b. The resistance chip is covered with a passivation film 62e substantially over its entirety.

In the inductor chip 60D shown in FIGS. 5-4(a) and 5-4(b), an insulating material layer 62g and redistribution lines 62h are formed using the WCSP process in a wafer formed with a SiO2 film 62a by the semiconductor process. At this time, inductors 62D each corresponding to a passive element 62 are formed by an etching technique for the redistribution lines 62h. Thereafter, a Si substrate of the wafer is peeled from the SiO2 film layer 62a, and only an EFB bonding layer 61 and the inductors 62D formed by the WCSP process are caused to remain. Each of connecting pads 62d is connected to its corresponding redistribution line 62h. The thickness of the inductor chip 60D ranges from about 5.0 to 10.0 µm.

According to the third embodiment, the thin type 60 (corresponding to each of 60A through 60D) of, for example, 10.0 µm or less fabricated by the semiconductor process or WCSP process is mounted on the semiconductor element 70 by the EFB technique. Thus, a chip parts mounting area on the interposer substrate 80 becomes unnecessary and the thinning and miniaturization of a package, which were problems associated with the conventional MCP, are enabled.

Fourth Preferred Embodiment

Figure 6:
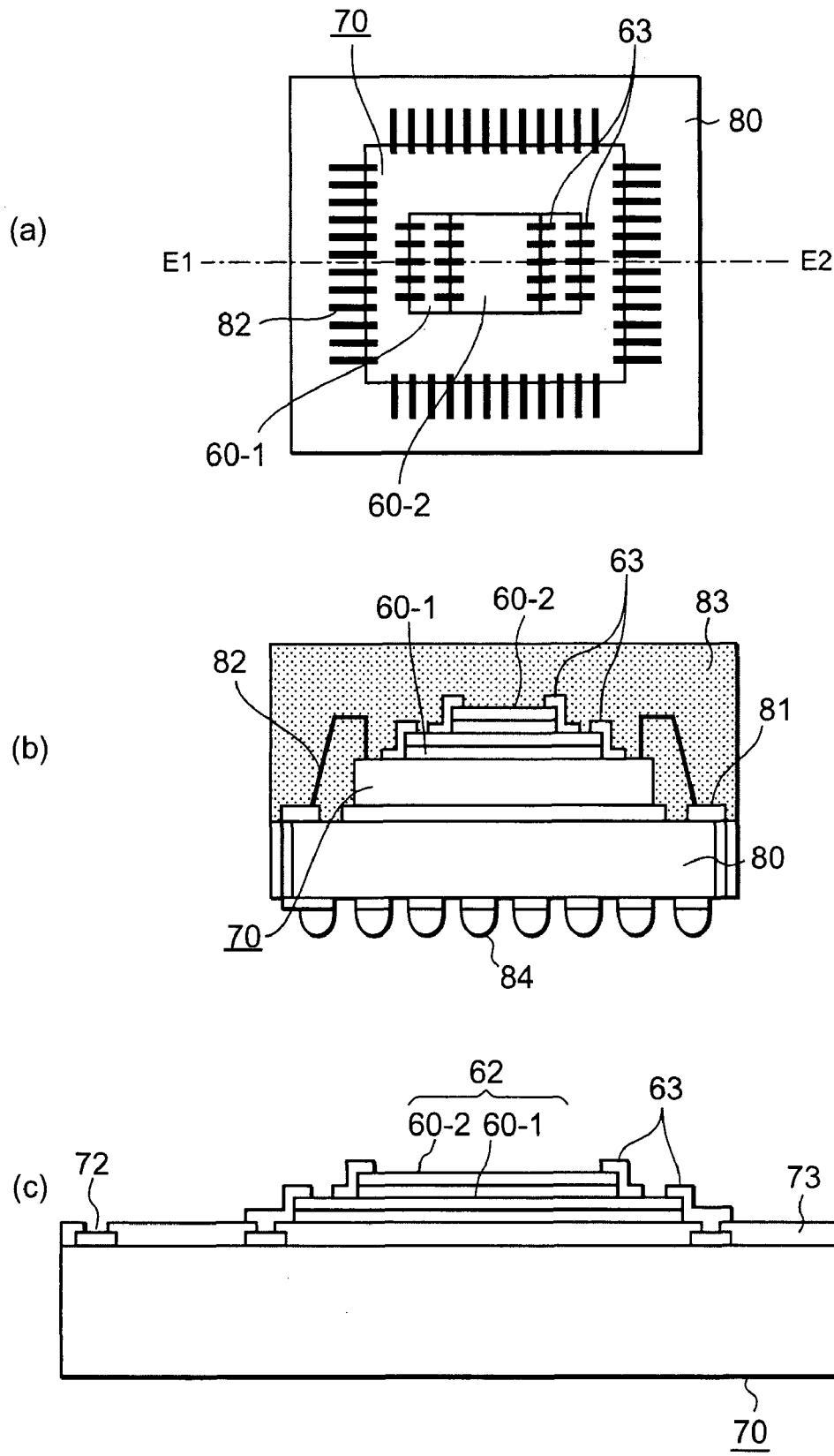
FIG. 6 is a typical structural view of a semiconductor device showing a fourth embodiment of the present invention.

FIGS. 6(a) through 6(c) are typical structural views of a semiconductor device showing a fourth embodiment of the present invention, wherein FIG. 6(a) is a plan view, FIG. 6(b) is a cross-sectional view taken along line E1-E2 of FIG. 6(a), and FIG. 6(c) is an enlarged cross-sectional view of an IPD and a semiconductor element portion in FIG. 6(b).

The semiconductor device according to the fourth embodiment has an IPD 60-1 similar to the IPD 60 of the third embodiment and an IPD 60-2 that is one size smaller than the IPD 60-1 in outer shape. The IPD 60-2, which is one size smaller than the IPD 60-1 in outer shape, is mounted on the IPD 60-1 mounted over a semiconductor element 70 by an EFB technique. The upper IPD 60-2 and the lower IPD 60-1 are electrically connected to each other by metal wirings 63 formed using a plating technique or a sputter technique.

According to the fourth embodiment, the IPD 60-2 that be side smaller than the IPD 60-1 in outer shape is mounted on the IPD 60-1 mounted on the semiconductor element 70 by the EFB technique. Therefore, a chip parts mounting area on an interposer substrate 80 becomes unnecessary and the thinning and miniaturization of a package, which were problems associated with the conventional MCP, are enabled. In addition to it, the combining of passive elements 62 and an increase in the specs of each passive element 62 are also enabled.

Fifth Preferred Embodiment

Figure 7:
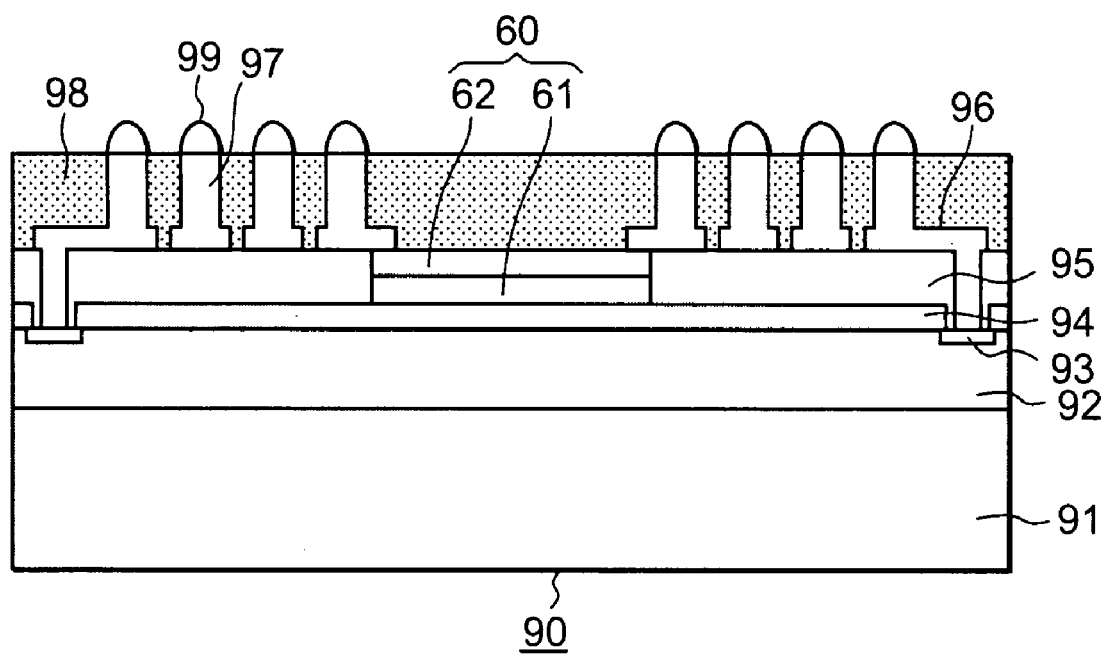
FIG. 7 is a typical cross-sectional view of a semiconductor device showing a fifth embodiment of the present invention.

FIG. 7 is a typical cross-sectional view of a semiconductor device showing a fifth embodiment of the present invention.

The semiconductor device according to the fifth embodiment has a structure in which an IPD 60 similar to that of the third embodiment is built in a WCSP.

The IPD 60 in which a passive element 62 is formed on a Si substrate, is peeled from a SiO2 layer of the Si substrate through a semiconductor process. Thereafter, the IPD 60 is mounted on a predetermined spot placed on a semiconductor element 90 held in a wafer state, by an EFB bonding method. Metal wirings formed using a plating technique or a sputter technique electrically connect between the IPD 60 and the semiconductor element 90.

An insulating material layer 95, redistribution lines 96 and posts 97 are formed in the semiconductor element 90 with the IPD 60 mounted thereon by a WCSP process. Further, a circuit surface is covered with a sealing resin 98 and thereafter solder terminals 99 are formed, after which semiconductor element fractionizing is done. Incidentally, the IPD 60 is electrically connected to the solder terminals 99 or connecting pads 93 of the semiconductor element 90 by the redistribution lines 96 of the WCSP. The IPD 60 used in the present embodiment may preferably be fabricated by the semiconductor process as in the capacitor chip 60A, the inductor chip 60B and the resistance chip 60C shown in FIGS. 5-1 through 5-3.

According to the fifth embodiment, the thin type IPD 60 from which the Si substrate is removed, is mounted on the semiconductor element 90 by the EFB technique and thereafter packaged by the WCSP process. Therefore, the passive element 62 can be built in the WCSP and greater functionality of the WCSP is enabled.

Sixth Preferred Embodiment

Figure 8:
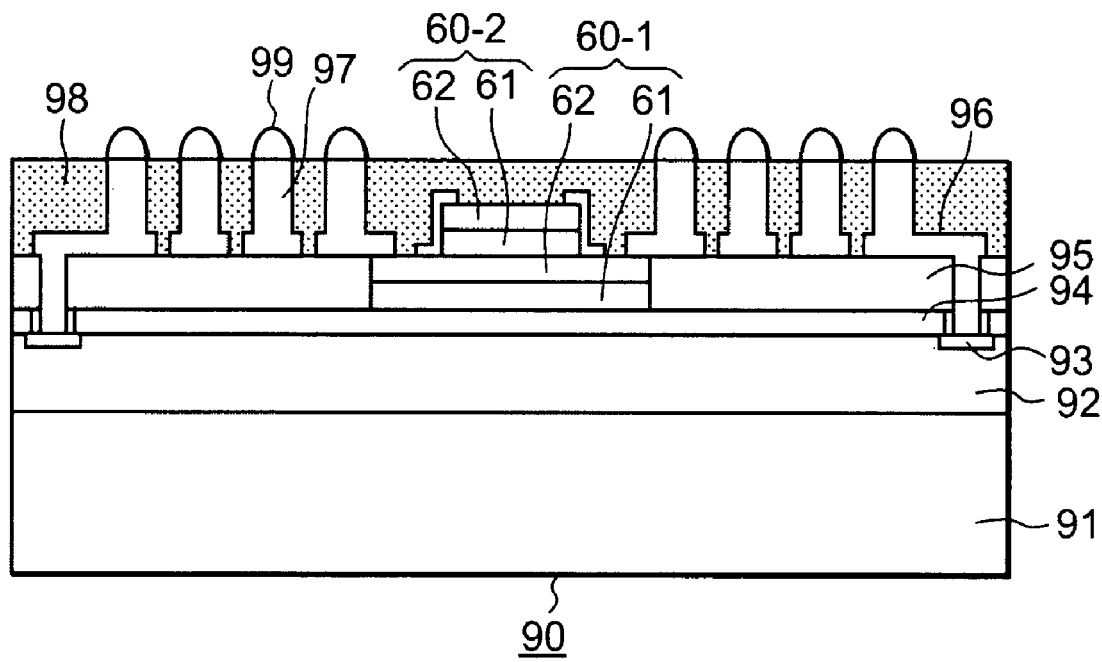
FIG. 8 is a typical cross-sectional view of a semiconductor device showing a sixth embodiment of the present invention.

FIG. 8 is a typical cross-sectional view of a semiconductor device showing a sixth embodiment of the present invention.

The semiconductor device according to the sixth embodiment has an IPD 60-1 similar to the IPD 60 of the fifth embodiment and an IPD 60-2 that is one size smaller than the IPD 60-1 in outer shape. The IPD 60-2, which is one size smaller than the IPD 60-1 in outer shape, is mounted on the IPD 60-1 mounted over a semiconductor element 90 by using an EFB technique. The upper IPD 60-2 and the lower IPD 60-1 are electrically connected to each other by metal wirings formed using a plating technique or a sputter technique.

According to the sixth embodiment, the IPD 60-2 that be side smaller than the IPD 60-1 in outer shape is mounted on the IPD 60-1 mounted on the semiconductor element 90 by using the EFB technique in a manner nearly similar to the fourth embodiment. Therefore, a chip parts mounting area on an interposer substrate becomes unnecessary and the thinning and miniaturization of a package, which were problems associated with the conventional MCP, are enabled. In addition to it, the combining of passive elements 62 and an increase in the specs of each passive element 62 are also enabled.

Seventh Preferred Embodiment

Figure 9:
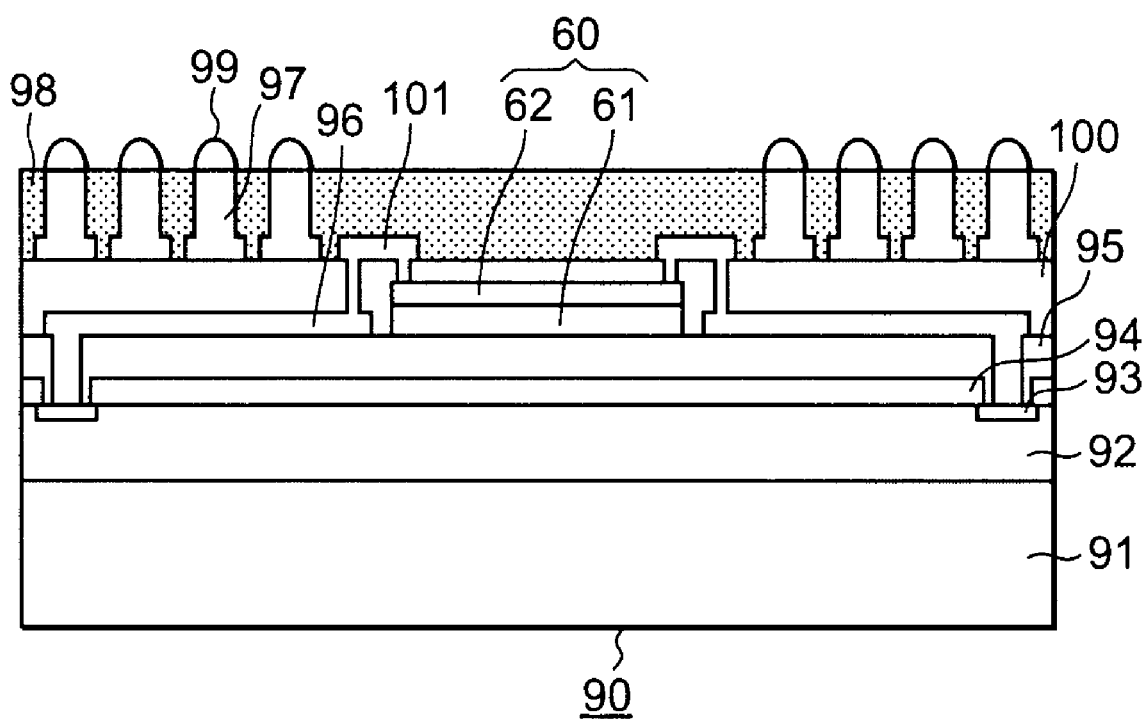
FIG. 9 is a typical cross-sectional view of a semiconductor device showing a seventh embodiment of the present invention.

FIG. 9 is a typical cross-sectional view of a semiconductor device showing a seventh embodiment of the present invention.

The semiconductor device according to the seventh embodiment has a structure in which an IPD 60 is built in a WCSP.

The IPD 60 in which a passive element 62 is formed on a Si substrate, is peeled from a SiO2 layer of the Si substrate through a semiconductor process. Thereafter, the IPD 60 is mounted to a predetermined position of a semiconductor element 90 held in a state in which a redistribution line 96 corresponding to a first layer is made by a WCSP process, by means of an EFG bonding method. Then, a second insulating material layer 100 and a second redistribution line layer 101 are formed by a two-layer wiring technique for the WCSP process. Further, posts 97 are formed and sealed with a sealing resin 98 and solder terminals 99 are formed, after which product fractionizing is done. Incidentally, the IPD 60 is electrically connected to the solder terminals 99 or connecting pads 93 of the semiconductor element 90 through the second redistribution line layer 101 of the WCSP.

The seventh embodiment is effective in enhancing a Quality Factor of the inductor chip 60B fabricated in the semiconductor process as shown in FIG. 5-2

According to the seventh embodiment, the thin type IPD 60 from which the Si substrate is removed, is mounted in the forming layer of the redistribution line 96 formed by the WCSP process by means of the EFB technique, and packaged through the WCSP process. Thus, since the seventh embodiment is capable of ensuring the interval between the Si substrate and the passive element forming layer as compared with the fifth and sixth embodiments, the coupling between the passive element 62 and the Si substrate 91 located on the IPD 60 is reduced and a loss of energy can hence be suppressed.

Preferred Modifications

The present invention is not limited to the above embodiments. Various usage forms and modifications can be made. As the usage forms and modifications, may be mentioned, for example, the following ones (1) and (2).

(a) The present invention can be applied even to one using a bulk substrate in place of the SOI wafer (SOI substrate). Thus, advantageous effects nearly similar to the above embodiments can be obtained.

(b) Although the hydrogen bonding between the OH groups is used as the bonding method, another intermolecular bonding may be used.

What is claimed is:

1. A wafer level chip size package type semiconductor device, comprising:
   a mounted member;
   a circuit forming layer formed on the mounted member;
   a planarization layer formed on the circuit forming layer; and
   a circuit chip formed on the planarization layer, the circuit chip having a flat back surface fixed to the planarization layer by an intermolecular bonding force, and being smaller in size than the mounted member.

2. The wafer level chip size package type semiconductor device of claim 1, wherein the circuit chip further includes a thin film mounted thereon, and both the mounted member and the thin film are made from silicon.

3. The wafer level chip size package type semiconductor device of claim 1, wherein the circuit chip has a front surface and a back surface thereof subject to a planarization or flattening process in the order of a nanomillimeter.

4. The wafer level chip size package type semiconductor device of claim 1, wherein the circuit chip is stacked on the planarization layer,
the planarization layer is stacked on the circuit forming layer, and
the circuit forming layer is stacked on the mounted member.

5. The wafer level chip size package type semiconductor device of claim 1, wherein the circuit chip has nanomillimeter-scale planarized front and back surfaces.

* * * * *